(12) United States Patent
Chaji

(10) Patent No.: US 12,236,907 B2
(45) Date of Patent: Feb. 25, 2025

(54) SHARED PIXEL CIRCUITS

(71) Applicant: VueReal Inc., Waterloo (CA)

(72) Inventor: Gholamreza Chaji, Waterloo (CA)

(73) Assignee: VueReal Inc., Waterloo (CA)

( * ) Notice: Subject to any disclaimer, the term of this patent is extended or adjusted under 35 U.S.C. 154(b) by 0 days.

(21) Appl. No.: 18/552,989

(22) PCT Filed: Mar. 31, 2022

(86) PCT No.: PCT/CA2022/050489
§ 371 (c)(1),
(2) Date: Sep. 28, 2023

(87) PCT Pub. No.: WO2022/204816
PCT Pub. Date: Oct. 6, 2022

(65) Prior Publication Data
US 2024/0185809 A1  Jun. 6, 2024

Related U.S. Application Data

(60) Provisional application No. 63/168,470, filed on Mar. 31, 2021.

(51) Int. Cl.
  *G09G 3/34* (2006.01)
  *G09G 3/20* (2006.01)

(52) U.S. Cl.
  CPC ......... *G09G 3/3426* (2013.01); *G09G 3/2003* (2013.01); *G09G 2320/0242* (2013.01)

(58) Field of Classification Search
  CPC . H01L 27/00; H01L 27/156; H01L 27/14601; H01L 27/14609
  See application file for complete search history.

(56) References Cited

U.S. PATENT DOCUMENTS

| | | | |
|---|---|---|---|
| 8,059,234 B2 | 11/2011 | Tsao et al. | |
| 2009/0201230 A1* | 8/2009 | Smith | G09G 3/3283 345/76 |
| 2014/0347402 A1* | 11/2014 | Kaplan | G09G 3/3258 345/690 |
| 2017/0031187 A1* | 2/2017 | Douyou | G02B 6/001 |
| 2017/0345354 A1 | 11/2017 | Kawashima et al. | |
| 2018/0293942 A1* | 10/2018 | Gu | G09G 3/3648 |
| 2022/0014694 A1* | 1/2022 | Johnson | H01L 27/14641 |

OTHER PUBLICATIONS

WIPO: International Search Report and Written Opinion relating to WO application No. PCT/CA2022/050489, dated Jun. 3, 2022.

* cited by examiner

*Primary Examiner* — Robert J Michaud

(57) ABSTRACT

The invention discloses an optoelectronic system may include an array of pixel circuits connected to optoelectronic devices. There can be different types of optoelectronic devices (for example, red, green and blue). These devices can be sensors, or light emitting devices or other types of devices. These devices may be optimized differently and to program the pixel circuits, a configuration of dataline for columns and address lines for rows is used.

30 Claims, 6 Drawing Sheets

1st Time period in the frame

|  | Row 1 | Row 2 | Row 3 |
|---|---|---|---|
| Column 1 | r | g | b |
| Column 2 | g | b | r |
| Column 3 | b | r | g |

2nd Time period in the frame

|  | Row 1 | Row 2 | Row 3 |
|---|---|---|---|
| Column 1 | g | b | r |
| Column 2 | b | r | g |
| Column 3 | r | g | b |

3rd time period in the frame

|  | Row 1 | Row 2 | Row 3 |
|---|---|---|---|
| Column 1 | b | r | g |
| Column 2 | r | g | b |
| Column 3 | g | b | r |

Figure 6A

Figure 6B

SHARED PIXEL CIRCUITS

FIELD OF THE INVENTION

The present disclosure relates to an optoelectronic system that may include an array of pixel circuits connected to optoelectronic devices.

SUMMARY

The invention relates to an optoelectronic system comprising an array of columns and rows, the system comprising, pixel circuits and optoelectronic devices connected to the pixel circuits, the pixel circuits being shared between more than one optoelectronic devices and the pixel circuit turning ON each optoelectronic device during a period of a frame wherein there is a black matrix at the end of the frame.

The invention also relates to a method to separate two consecutive frames, the method comprising, connecting pixel circuits and optoelectronic devices in an array of columns and rows, sharing the pixel circuits between more than one optoelectronic devices and turning ON each optoelectronic device through a pixel circuit during a period of a frame wherein there is a black matrix at the end of the frame.

BRIEF DESCRIPTION OF THE DRAWINGS

The foregoing and other advantages of the disclosure will become apparent upon reading the following detailed description and upon reference to the drawings.

FIG. 6A shows all the zones are programmed with the same color first, then the second color and then the third color.

FIG. 6B shows the front plane and backplane for each zone can be programmed with different colors.

Figure 1:
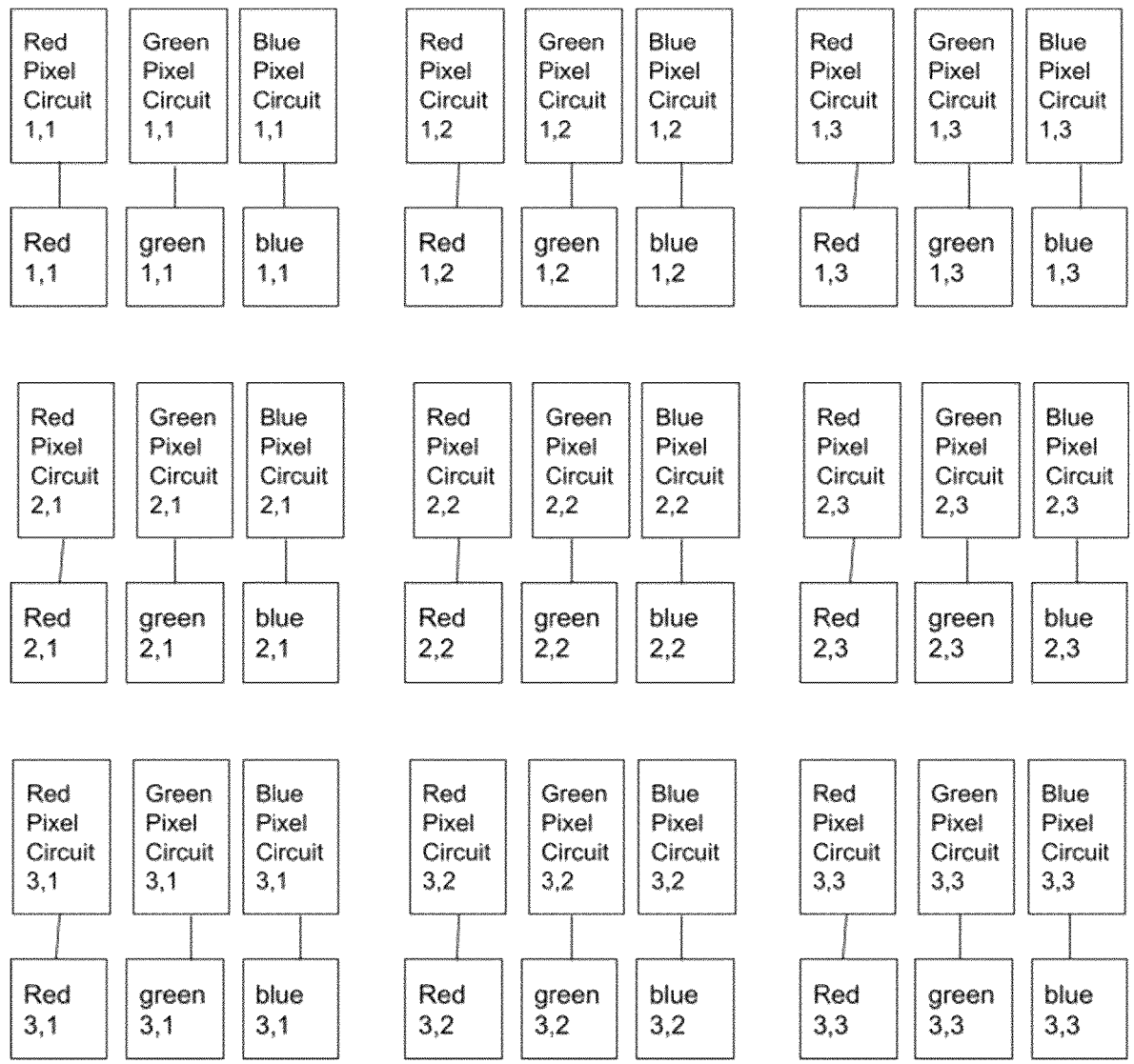
FIG. 1 shows different types of optoelectronic devices (for example, red, green, and blue where each device is connected to a pixel circuit.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

An optoelectronic system may include an array of pixel circuits connected to optoelectronic devices. As demonstrated in FIG. 1, there can be different types of optoelectronic devices (for example, red, green, and blue). These devices can be sensors, or light emitting devices or other types of devices.

The pixel circuits can be fabricated with different technologies such as thin film transistors or CMOS.

Each device (red (i,j), green (i,j), blue (i,j), i,j=1, 2, 3 . . . ) is connected to a pixel circuit (red pixel circuit (i,j), green pixel circuit (i,j), blue pixel circuit (i,j), i,j=1, 2, 3 . . . ) that can drive the device with a bias (current or voltage) or can read a signal from the device or pixel circuit.

In case of high resolution or high transparent display, the integration of many pixel circuits becomes challenging either reducing the yield, resolution or transparency.

Figure 2:
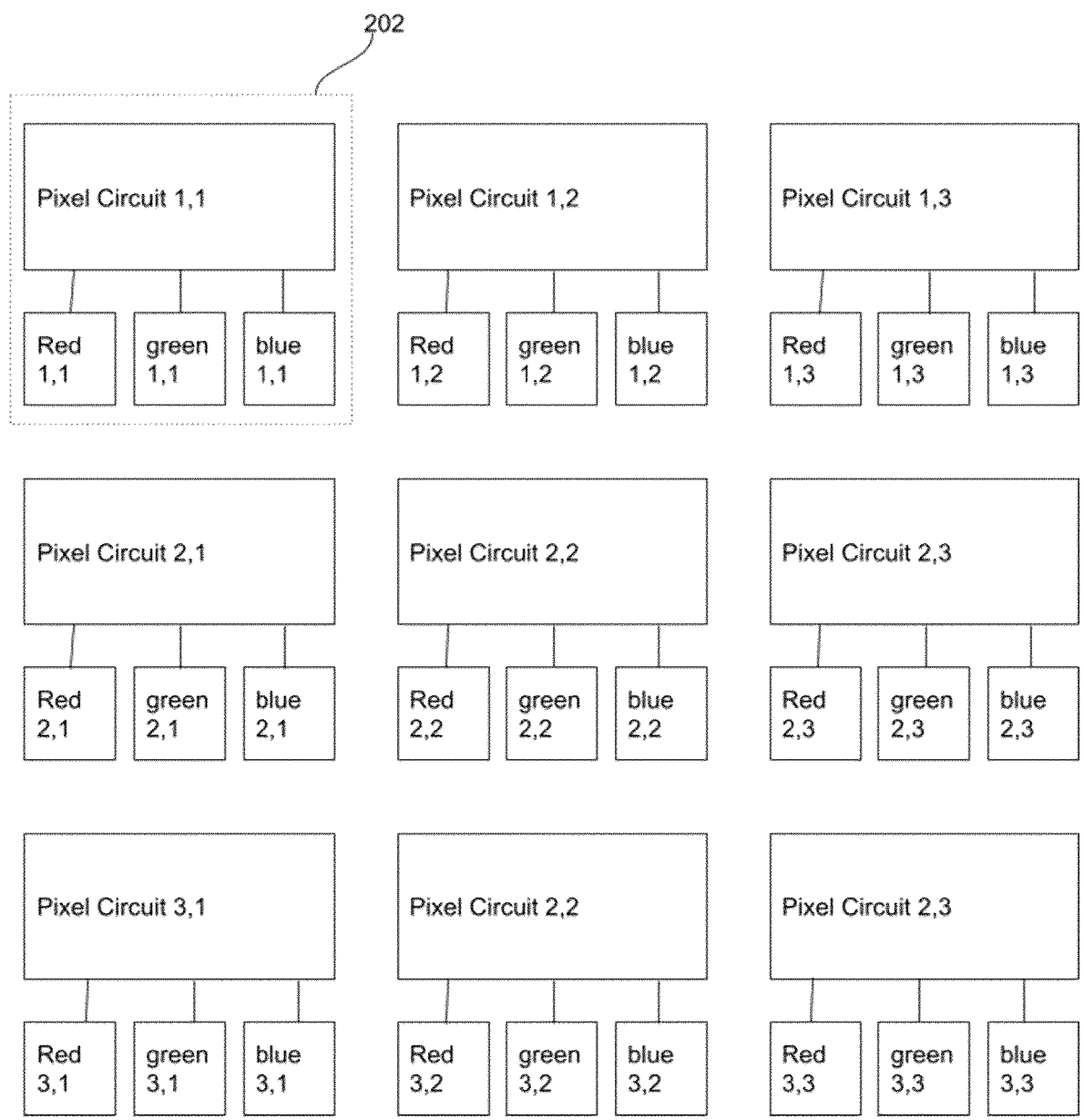
FIG. 2 shows an array of pixel circuits and optoelectronic devices connected to the pixel circuit.

FIG. 2 shows an optoelectronic system that includes an array of pixel circuits (pixel circuit (i,j), i,j=1, 2, 3) and optoelectronic devices (red (i,j), green (i,j), blue (i,j), i, j=1, 2, 3) connected to the pixel circuits (pixel circuit (i,j), i,j=1, 2, 3). The pixel circuits (pixel circuit (i,j), i,j=1, 2, 3) can be shared between more than one optoelectronic devices (red (i,j), green (i,j), blue (i,j), i, j=1, 2, 3).

In one case, the pixel circuit is shared between the optoelectronic devices in the same pixel (e.g. 202). Here, the pixel circuit is time shared between different devices. In one example, during the first part of the frame it is connected to the first optoelectronic device in the pixel (e.g. red (i,j) i, j=1, 2, 3, . . . ). During the second part of the frame time the pixel circuit is controlling or driving the second type of optoelectronic devices (e.g. green (i,j), i,j=1, 2, 3, . . . ). During the third part of the frame time, the pixel circuit is controlling or driving the third optoelectronic devices (e.g. blue (i,j), i,j=1, 2, 3, . . . ). The challenge with this approach is that it can create flicker and also in case of moving images in the display it can be perceived as color changes at the edges. In one related case, the pixel circuits are shared between different types of devices during the same time frame. For example in one case, at least one of each device type is on during the same time of the frame. In one related embodiment, the sequence of turning on devices with the same pixel can be repeated more than one time. Here, the sequence also can be modified during each time. For example, the frame has three sub frames. The first sub frame can have a sequence of red, green, blue and then the next subframe can be green, blue, red and the 3rd subframe can be blue, red, green. The duration of each subframe can be adjusted for optimized performance or creating display information. For example, the first subframe can be 4 times wider than the 2nd one and the 2nd one can be twice longer than the 3rd one. As a result, not only the sequence is repeated during each subframe (With different order), the value can be adjusted depending on the duty cycle of each subframe as well. The duration of each color can be also optimized for power consumption, brightness or more.

Figures 3A, 3B:
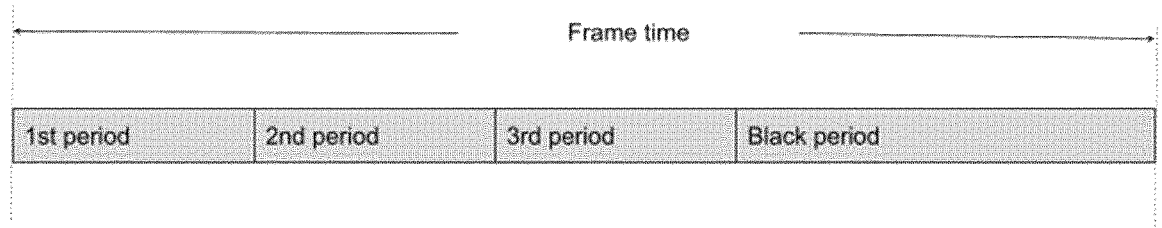
FIG. 3A shows a timing diagram of pixel activation.
FIG. 3B shows the new structure is bonded to a substrate

In one related embodiment, the adjacent pixel circuits are controlling two different types of devices during the same times of a frame. The timing diagram in FIG. 3A shows one example of that case where two adjacent pixels do not activate the same device during the same frame time. For example, a pixel located in position (1,1) has a different color than the pixel located in (1,2) or the pixel located in (2,1). Furthermore, as shown in FIG. 3B, a black frame can be added at the end of the final section (e.g. 3rd period) where the last set of the devices are activated. This can separate the two consecutive frames resulting in less color shifts.

The optoelectronic system mentioned here also relates to a method to separate two consecutive frames, the method comprising, connecting pixel circuits and optoelectronic devices in an array of columns and rows, sharing the pixel circuits between more than one optoelectronic devices and turning ON each optoelectronic device through a pixel circuit during a period of a frame wherein there is a black matrix at the end of the frame. The following figures discussed after also highlight the different aspects of the system as well the method in general.

The challenge with sharing the pixel circuits with different devices in a pixel is that each device may need different optimized pixel circuits. For example, red, green, and blue devices may need different current bias levels. If the same pixel circuit is shared with different devices, it may not be possible to optimize the circuit to work efficiently for each red, green, and blue pixel. The other related embodiment is to have optimized pixel circuits for each optoelectronic device type. The optimization can be done according to offering the required current or optimized for gray levels, contrast ratio, and so on. Here the pixel circuit is shared with the same type of adjacent optoelectronic devices.

Figure 4:
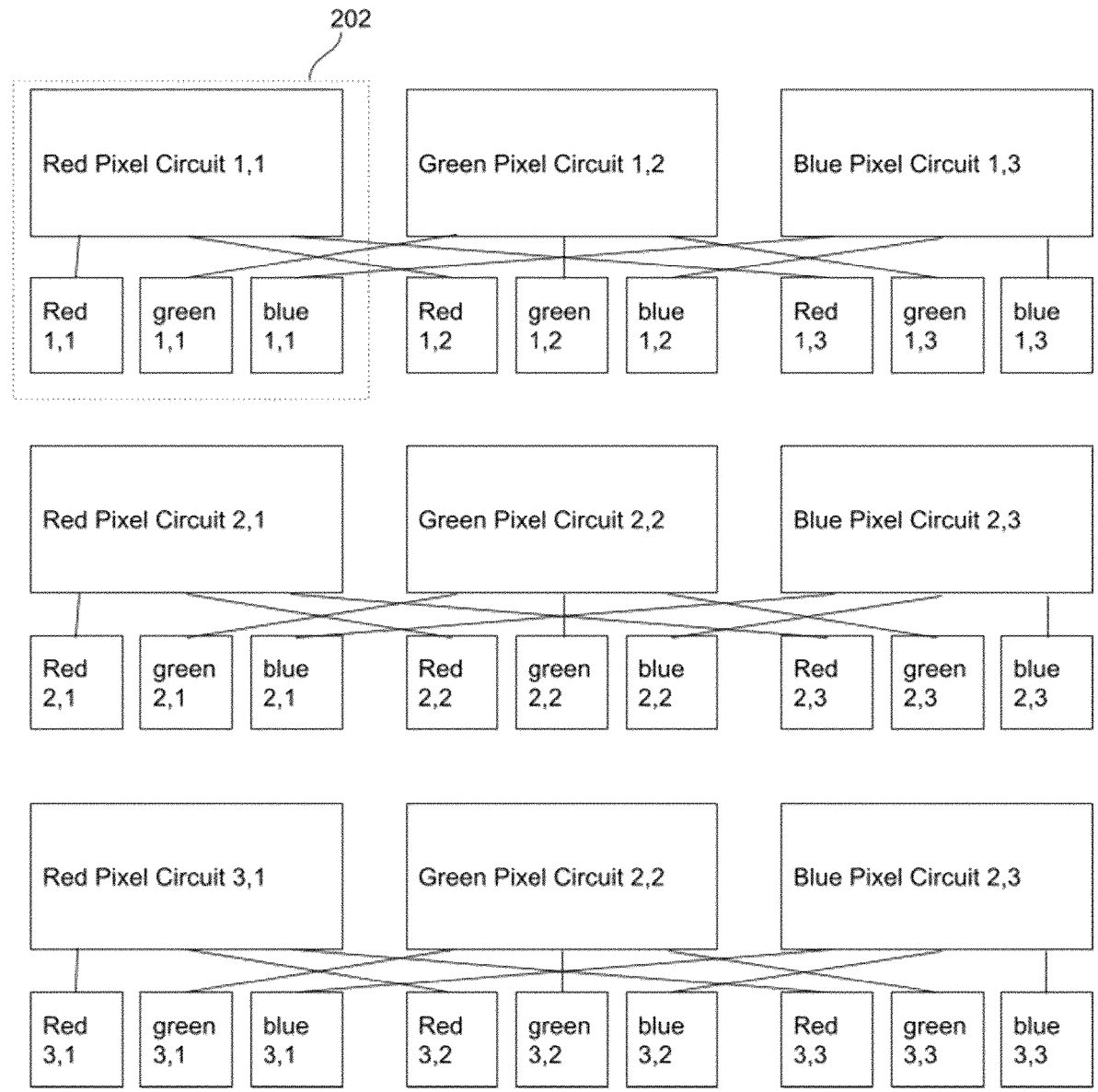
FIG. 4, shows sharing of pixel circuits with different devices.

FIG. 4 shows one exemplary embodiment of this configuration. Here, 1st optimized pixel circuits (red pixel circuit (i,j) i,j=1, 2, 3 . . . ) are shared between the 1st type of optoelectronic devices (red (i,j)=1, 2, 3 . . . ). The 2nd optimized pixel circuits (green pixel circuit (i,j); i,j=1, 2, 3 . . . ) are shared between the 2nd type of optoelectronic devices (green (i,j)=1, 2, 3 . . . ). The 3rd optimized pixel circuits (blue pixel circuit (i,j); i,j=1, 2, 3 . . . ) are shared between the 3rd type of optoelectronic devices (blue (i,j)=1, 2, 3, . . . ). This can be repeated between more than optoelectronic devices.

The same timing and configuration presented in FIGS. 3A and 3B can be used for the configuration in FIG. 4.

To program the pixel circuits, configuration of dataline for columns and address lines for rows are used. At least one control or address line for a row is activated and the data from the dataline is programmed into the pixel or the data from the pixel is transferred into the dataline. After programming one row, the address/control line is deactivated, and the next row is activated. All rows are typically programmed during each frame or period of time. As the pixels need to be reprogrammed several times during each frame time, achieving high frame rate and high resolution may be challenging. To address this issue, multiple data lines can be used for each column. This allows programming multiple pixels in each column. Here, the address/control line for more than one row is activated while different datalines are connected to the pixels in each row.

Figure 5:
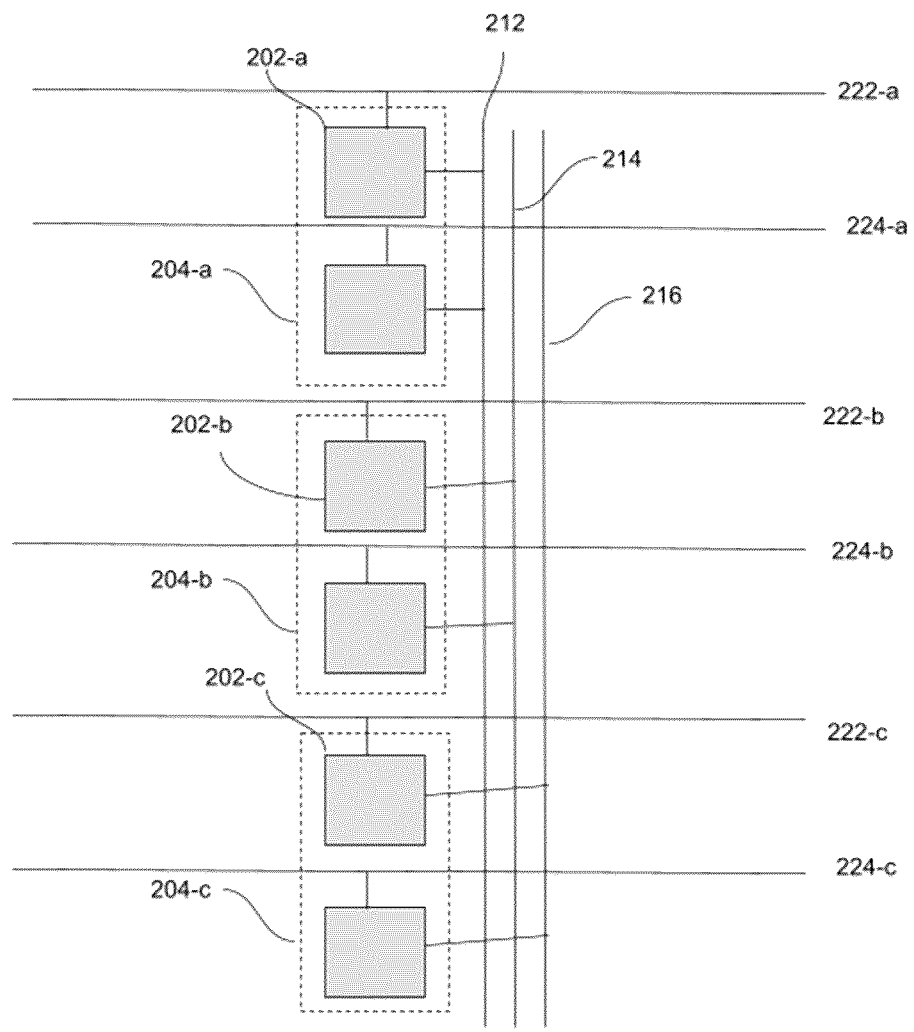
FIG. 5 shows an embodiment for using multiple data lines for each column

FIG. 5 shows an embodiment for using multiple data lines for each column (more than one column can exist in an array). Here, the pixels 202 (a, b, c . . . ) in the columns are set into different groups 204a, 204b, 204c. A different dataline 212, 214, 216 is connected to each group. During programming a address/control line 222, 224 (a, b, c . . . ) from each group is activated as a result one row from each group is activated to get programmed (controlled). The groups can be distributed differently in columns. In one case, the column is divided into several consecutive sections matching the number of datalines. In another case, no two adjacent pixels are allocated to the same group. In a related case, a number of adjacent pixels are allocated to 1st group 204a (related to the 1st data line 212). A second set of adjacent pixels are allocated to 2nd group 204b (related to the 2nd data line 214). And a 3rd set of adjacent pixels are allocated to a 3rd group 204c (related to 3rd data line 216). This pattern can be repeated across the column. The number of group types and data lines can be configured differently. The structure of FIG. 5 can be used with any of the structures discussed above. Also, it can be used with structures with no pixel circuit sharing.

Also, control lines can be used as row lines to connect the pixel to different optoelectronic devices. In this case, the control lines can be shared between rows in one group type or control similarly for the rows in one group.

In one related case, a front plane can be used to increase the resolution of the said optoelectronic system here. The front plane can be liquid crystal or MEMS or other types. Here, the front plane is synchronized with the pixels 202 in the structure of FIG. 5.

In one case, if the optoelectronic system is a display, a full color image is demonstrated on the optoelectronic system (backlight) and the front plane has a color filter and shows the higher resolution image. Here, each optoelectronic device is associated with several pixels in the high resolution front plan. The full color low resolution image can be constructed based on picking the maximum brightness for each color associated with the higher resolution image and program the optoelectronic device associated with that color with the value corresponding to the maximum brightness value.

In another related case, if the number of pixels that have a maximum brightness associated with the area in the frontplane pixels is less than a first threshold number, a lower brightness than the maximum brightness can be used for the backlight in that area. The lower brightness can be the brightness that is lower than maximum brightness and pixels in the frontplane area have that brightness value and the number of pixels is more than a second threshold number. The second threshold value can be different from the first threshold value.

In another related embodiment, the front plane does not have a color filter. Here, the backlight color is turned on sequentially and the front plane is programmed for the same color during each period. Here, similar pixel circuit sharing, and timing described in FIGS. 2, 3 and 4 can be used.

FIG. 6 (comprising 6A and 6B) shows two different combinations of front plane and backplane (optoelectronic system). Here the backlight zone can be the same group types used in FIG. 5. During a programming time (P) both front plane or backlight are set and activated for the same color. Then, the backlight is turned ON for that color and as a result the portion of image associated with the color in a set zone is presented. The backlight associated with that zone is programmed with a value that provides the highest brightness for the frontplane zone. The backlight programming value can be calculated based on the highest brightness associated with the pixels in the front plane zone that the number pixels in the zone with that brightness is higher than a threshold number.

Figures 6A, 6B:
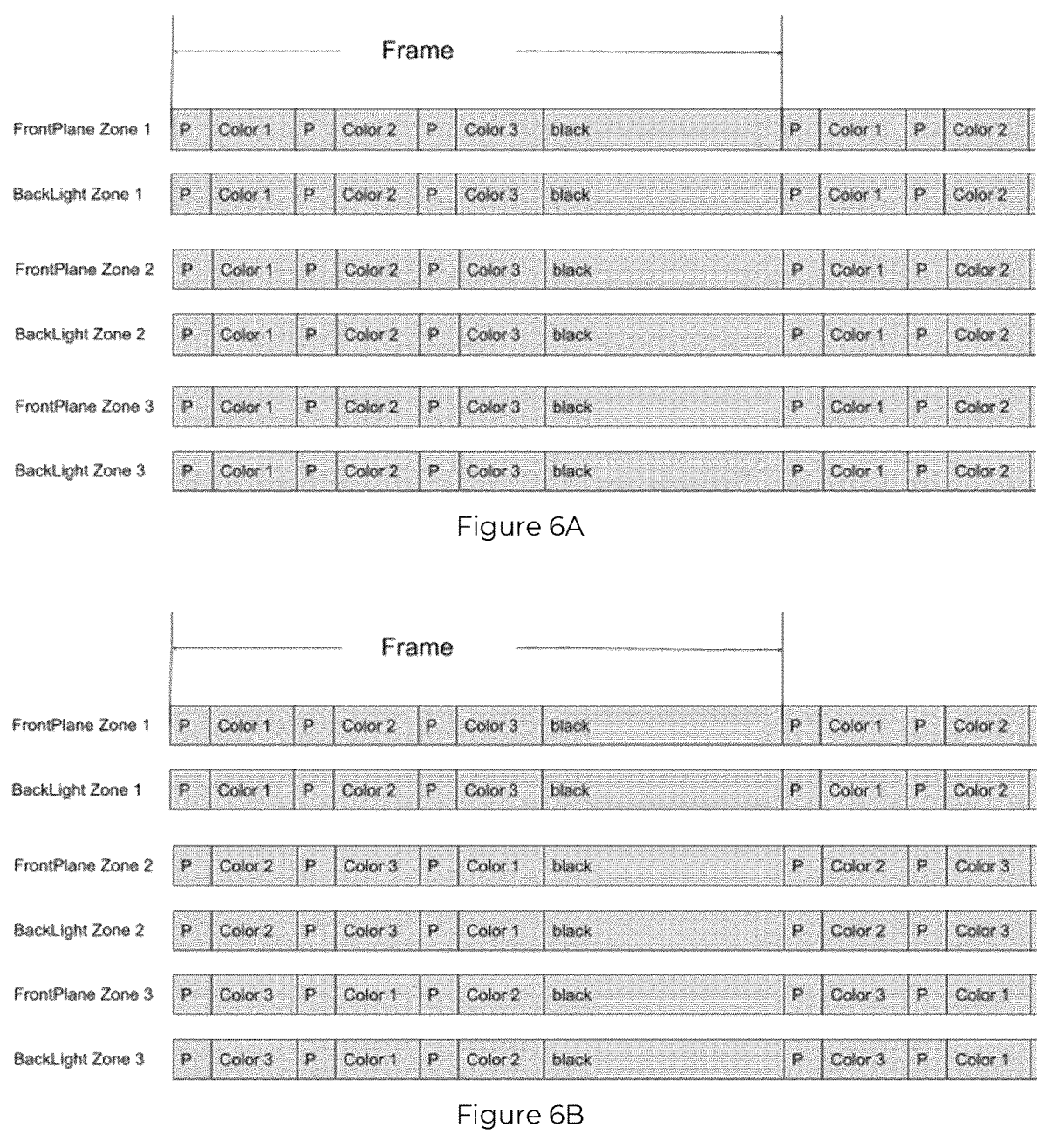

In one case, as shown in FIG. 6A, all the zones are programmed with the same color first, then the second color and then the third color. A black time can be added at the end of the frame to reduce the color bleeding to the next frame. Here, similar to FIG. 5, each zone in the backlight and front plane can have a different dataline for each column. As a result, the zones can be programmed at the same time.

In another related zone, the front plane and backplane for each zone can be programmed with different colors (FIG. 6B). The advantage of this approach is that less color shift can be observed. However, the color can bleed between each zone causing color degradation at the boundary of each zone.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

The invention claimed is:

1. An optoelectronic system comprising an array of columns and rows, the system comprising:
   pixel circuits and optoelectronic devices connected to the pixel circuits;
   the pixel circuits being shared between more than one optoelectronic devices; and
   the pixel circuit turning ON each optoelectronic device during a period of a frame wherein there is a black matrix at the end of the frame,
   wherein more than one dataline is used to program one column and different groups of pixel circuits in the column are connected to a different dataline.

2. The optoelectronic system of claim 1, wherein at least for two adjacent pixels, different optoelectronic devices are turned ON during a period of the frame time.

3. The optoelectronic system of claim 1, wherein the pixel circuits are shared between similar types of optoelectronic devices from adjacent pixels.

4. The optoelectronic system of claim 1 where at least two pixels in the columns are programmed at the same time.

5. The optoelectronic system of claim 1, wherein the pixel circuit is shared between the optoelectronic devices in a same pixel wherein the pixel circuit is time shared between different devices.

6. The optoelectronic system of claim 1, wherein during a first part of the frame it is connected to a first optoelectronic device in the pixel, during a second part of the frame the pixel circuit is controlling a second type of optoelectronic device and during a third part of the frame time, the pixel circuit is controlling a third optoelectronic device.

7. The optoelectronic system of claim 1, wherein two adjacent pixels do not activate a same device during a period of the frame.

8. The optoelectronic system of claim 1, wherein the pixel circuits are optimized differently for each device wherein a current bias level is different.

9. The optoelectronic system of claim 8, wherein there are optimized pixel circuits for each optoelectronic device type wherein the optimized pixel circuit is shared with a same type of adjacent optoelectronic devices.

10. The optoelectronic system of claim 8, wherein to program the pixel circuits, a configuration of dataline for columns and address lines for rows is used and least one control or address line for a row is activated and the data from the dataline is programmed into the pixel or the data from the pixel is transferred into the dataline.

11. The optoelectronic system of claim 10, wherein after programming one row, the address/control line is deactivated, and the next row is activated.

12. The optoelectronic system of claim 8, wherein all rows are programmed during each frame or a period of time.

13. The optoelectronic system of claim 8, wherein as the pixels need to be reprogrammed several times during each frame time, multiple data lines are used for each column to program multiple pixels in each column, wherein further, the address/control line for more than one row is activated while different datalines are connected to the pixels in each row.

14. The optoelectronic system of claim 1, wherein the pixels in the columns are set into different groups such that a different dataline is connected to each group.

15. The optoelectronic system of claim 14, wherein during programming an address/control line from each group is activated as a result one row from each group is activated to get programmed.

16. The optoelectronic system of claim 15, wherein the column is divided into several consecutive sections matching the number of datalines.

17. The optoelectronic system of claim 14, wherein no two adjacent pixels are allocated to the same group.

18. The optoelectronic system of claim 14, wherein a set of adjacent pixels are allocated to one group with this pattern repeated across the column.

19. The optoelectronic system of claim 14, wherein the control lines are used as row lines to connect the pixel to different optoelectronic devices wherein the control lines are shared between rows in one group type.

20. The optoelectronic system of claim 19, wherein a front plane is used to increase the resolution of the said optoelectronic system here.

21. The optoelectronic system of claim 20, wherein the front plane is a liquid crystal or MEMS type wherein the front plane is synchronized with the pixels.

22. The optoelectronic system of claim 20, wherein the optoelectronic system is a display, a full color image is enabled on the optoelectronic system and the front plane has a color filter showing the higher resolution image.

23. The optoelectronic system of claim 22, wherein each optoelectronic device is associated with several pixels in the high resolution front plane and wherein further, a full color low resolution image is constructed based on picking a maximum brightness for each color associated with the higher resolution image and program the optoelectronic device associated with that color with the value corresponding to the maximum brightness value.

24. The optoelectronic system of claim 22, wherein if the number of pixels that have the maximum brightness associated with an area in the frontplane pixels is less than a first threshold number, a lower brightness than the maximum brightness is used.

25. The optoelectronic system of claim 20, wherein a backlight color is turned on sequentially and the front plane is programmed for the same color during each period.

26. The optoelectronic system of claim 20, wherein a backlight zone is the same group type used and during a programming time both the front plane or the backlight are set and activated for the same color.

27. The optoelectronic system of claim 26, wherein the backlight is turned ON for that color and as a result the portion of image associated with the color in a set zone is presented wherein further, the backlight associated with that zone is programmed with a value that shows the set of pixel values in the frontplane zone that is higher than a threshold number.

28. The optoelectronic system of claim 20, wherein all the zones are programmed with the same color first, then the second color and then the third color.

29. The optoelectronic system of claim 28, wherein a black time is added at the end of the frame to reduce the color bleeding to the next frame, wherein further, each zone in the backlight and front plane can have a different dataline for each column.

30. The optoelectronic system of claim 24, wherein the lower brightness is a brightness that is lower than the maximum brightness and pixels in the frontplane area have that brightness value and the number of pixels is more than a second threshold number.

* * * * *